Figure 1:
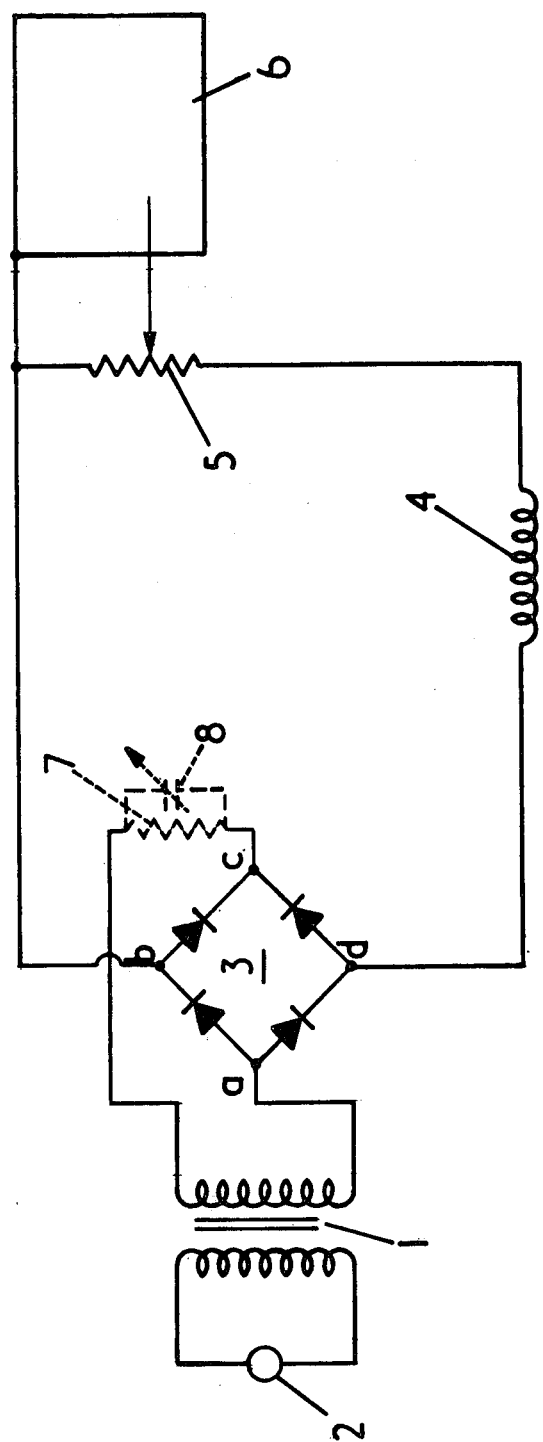

United States Patent [19]

Gray

[11] 4,187,523
[45] Feb. 5, 1980

[54] DETECTING A SHORT CIRCUIT FAULT IN A DYNAMO ELECTRIC MACHINE

[75] Inventor: George W. Gray, Sheffield, England

[73] Assignee: Coal Industry (Patents) Limited, London, England

[21] Appl. No.: 934,742

[22] Filed: Aug. 21, 1978

[30] Foreign Application Priority Data

Aug. 26, 1977 [GB] United Kingdom ............. 35907/77

[51] Int. Cl.² .............................................. H02H 7/08
[52] U.S. Cl. ......................................... 361/30; 361/42; 361/65; 361/79
[58] Field of Search ....................... 361/29, 30, 42, 47, 361/48, 49, 50, 79, 65, 83, 85

[56] References Cited
U.S. PATENT DOCUMENTS

| 2,462,799 | 2/1949 | Young et al. ......................... 361/79 X |
| 3,590,322 | 6/1971 | Carr ......................................... 361/42 |
| 4,106,069 | 8/1978 | Trautner et al. ......................... 361/30 |

Primary Examiner—Harry E. Moose, Jr.
Attorney, Agent, or Firm—James C. Wray

[57] ABSTRACT

A dynamo-electric machine is provided with a protective circuit arrangement whereby the machine is caused to be switched off if a short circuit current flowing in the machine exceeds a predetermined level.

False operation of the protective circuit is avoided by incorporating a discriminating circuit which is able to distinguish the phase angle between the current and the voltage. This causes the protective circuit to trip for an over load current where the phase angle difference is small and the power factor near unity, which occurs with resistive fault situations; and not to trip where the phase angle difference is high, and thus there is a low power factor indicating a reactive condition, which occurs on start-up of the machine. A machine is able to run more safely as a result.

8 Claims, 4 Drawing Figures

DETECTING A SHORT CIRCUIT FAULT IN A DYNAMO ELECTRIC MACHINE

The invention relates to an apparatus for operating a dynamo-electric machine, such as an electric motor, which is provided with a protective circuit arrangement whereby the machine is caused to be switched off if a short circuit current flowing in the machine exceeds a pre-determined level.

In many dynamo electric machines which are used as motors to drive heavy industrial machinery the machine is often located at a substantial distance from the power supply source and is connected to this source by a long trailing cable. Particular machinery of this kind is that used to drive coal cutting or tunnelling apparatus. On start-up of the motor it will take for a short period a large current and the value of this current is very little different in magnitude from the short circuit current at the end of a long trailing cable. The apparatus is normally equipped with protection apparatus which trips out the circuit to the motor during short circuit fault conditions in either the motor or its supply cable but in order to prevent inadvertent tripping during start-up the protection apparatus has previously had to be set at a level which is so high that during short circuit conditions it will not trip out. This has meant that the setting of the protection apparatus has often been such as to make it responsive only to very high currents on short circuit and thus insensitive and inoperative to lower short circuit currents which may circulate for a long period without being detected and protected against consequently causing heating and damage to the machine and its supply cables. If the protection apparatus has been set at a lower level to prevent against such damage there is the risk that the apparatus will react too early during the start-up and will cut-off the machine supply so that it is not able to start properly since the apparatus is unable to distinguish the transient start-up current of high value from the longer fault short-circuit current.

It is an object of the present invention to provide apparatus and a method which will allow short circuit faults at relatively low current levels such as, for example, three times full load current, to be determined without reacting to high start-up currents in excess of these low current levels.

According to one aspect of the present invention apparatus for operating a dynamo-electric machine which has a protective circuit arrangement whereby the machine is caused to be switched off if a short circuit current flowing in the machine exceeds a predetermined level a circuit, comprises means for deriving a d.c. voltage proportional to the current flowing in the machine, said means being connected with a voltage transformer connected across the machine supply and a current transformer having its input connected in the current supply to the machine, the d.c. voltage being arranged to be fed to the protective circuit during that period only of a cycle when the current and voltage waveforms of the motor supply are in phase.

The said means for deriving a d.c. voltage is preferably a full wave rectifier bridge connected across one of its diagonals to the output of the voltage transformer whose input is connected to the voltage supply source for the machine, and across the other of its diagonals to the current transformer in series with a resistor, the resistor being tapped and connected to the said protective circuit to supply the d.c. voltage.

If the dynamo electric machine is a three phase machine then a separate apparatus would be connected in each phase of the machine. A capacitor may be included in the output circuit of the voltage transformer to control the response time of the apparatus.

As an alternative to a bridge rectifier circuit it may be convenient to use a fast-switching semiconductor device, such as a transistor. A further alternative is to use a Hall Plate transducer.

The use of the invention gives the advantage that it is now possible to discriminate positively between start-up currents of a highly reactive, and thus low power factor, nature and short-circuit currents of a highly resistive, and hence high power factor, nature. This means that there is no risk of a protective circuit tripping out a machine on start-up by wrongly identifying a high value start-up current for a fault short circuit current. Thus a protective circuit for the machine can be set to protect the machine or a long trailing cable supplying it when a fault develops during normal running by switching off the supply current when a relatively low short circuit current arises, e.g. 3 times full load current, but can allow a relatively high start up current, e.g. 7 times full load current, to flow without the protective circuit operating.

According to a second aspect of the invention, a method of operating a dynamo-electric machine which is provided with a protective circuit arrangement to protect the machine against short circuits currents above a predetermined level, includes the steps of monitoring the power factor of the dynamo-electric machine, deriving a d.c. voltage proportional to the resistive element of the current, i.e. the power factor, and feeding the voltage to the protective circuit.

In a preferred method the steps include feeding across one diagonal of a full wave rectifier bridge a voltage derived from the voltage supply to the machine, and across the other diagonal a current derived from the current flowing in the circuit of the machine, obtaining from the rectifier bridge an output current related to the relative phases of current and voltage supplied to the machine and also to the amplitude of the current in the circuit and deriving therefrom a voltage proportional to said output current and supplying this voltage to a protective circuit.

Figure 2:
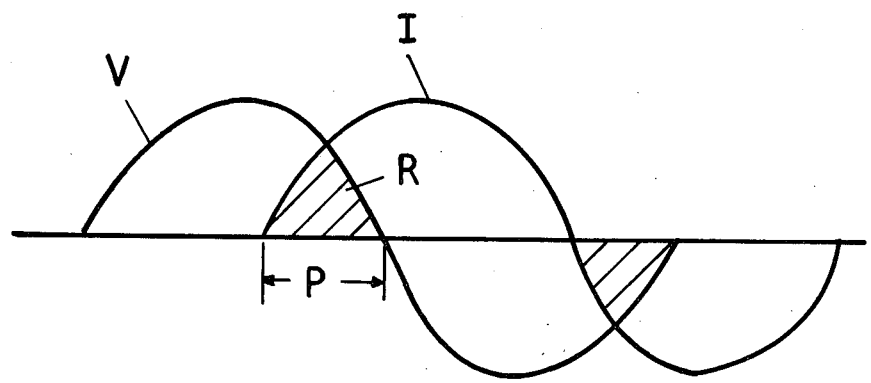
Figure 3:
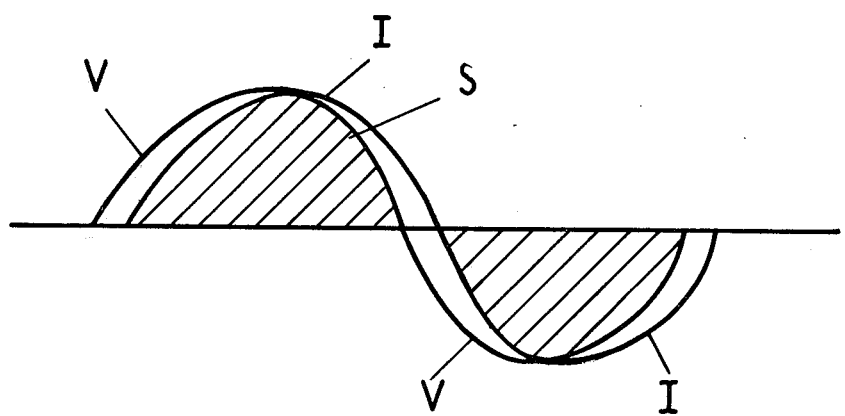
Figure 4:
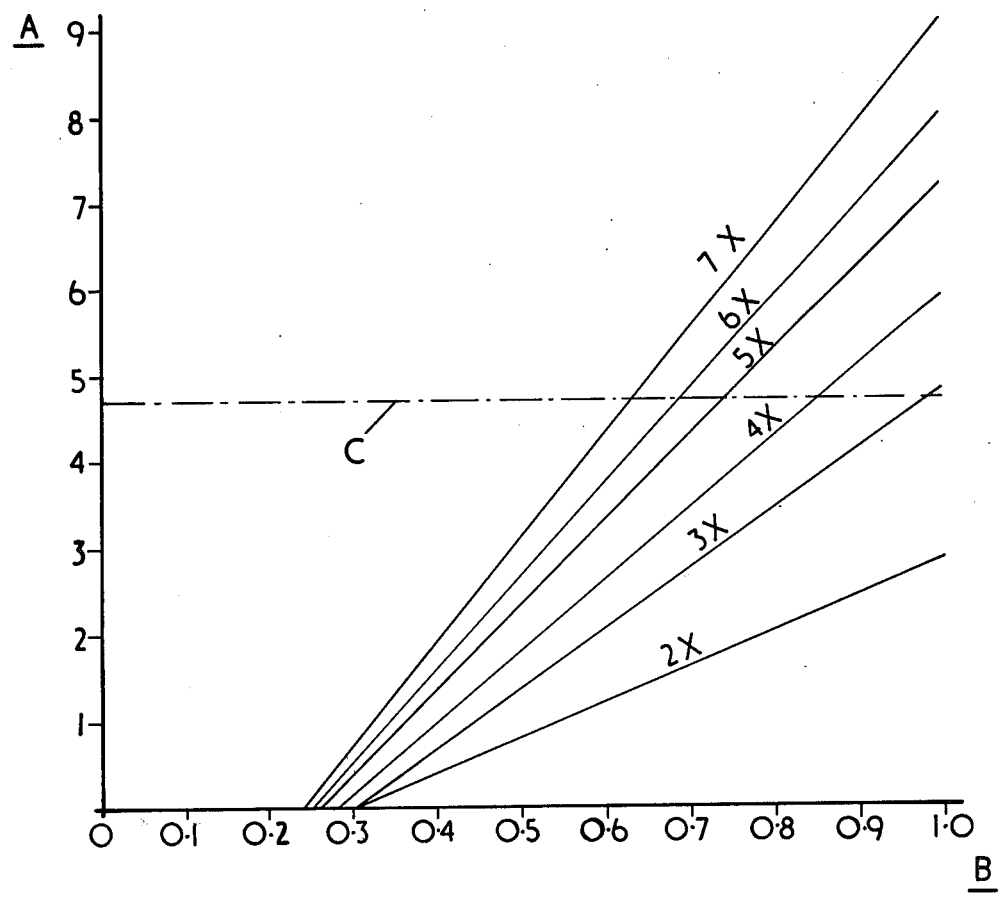

One embodiment of apparatus of the invention and using the method thereof will now be described, by way of example only, with reference to the accompanying drawings in which FIG. 1 shows a schematic circuit diagram, FIGS. 2 and 3 show the phase relationship on a time base of the voltage and current flowing in the circuit of FIG. 1 at different power factors, and FIG. 4 is a graphical representation of the effect of power factor on the input voltage to a protective circuit for various multiples of full load current.

Referring first to FIG. 1 of the drawings the apparatus of the invention is used to protect the electric motor of a 200 H.P. coal face mining machine against faults developed through short circuit conditions occurring whilst it is operating. The machine is assumed to operate on a longwall face of some 260 yards length and to be supplied with power from a trailing cable connecting the motor of the machine to a transformer unit in the gate end of the face.

The circuit of FIG. 1 comprises a voltage transformer 1 connected on its primary side to the machine supply source 2, and feeding from its secondary side a voltage across one diagonal of a full wave four arm rectifier bridge 3 at terminals a and c. A current transformer winding 4 is connected in series with a load resistance 5 to terminals b and d of bridge 3 and thus across the other diagonal of the bridge 3. The current transformer winding 4 is connected with the line supply to the machine (not shown) and produces an output related to the current flowing in the machine motor. A d.c. voltage is tapped off from resistor 5 and supplied to a protective circuit 6 which is a short-circuit trip module of standard form, such as a Baldwin and Francis Module reference O/L 4, connected to operate to disconnect the machine motor from the supply 2 in the event of an excess current being detected in the circuit of the motor of the machine. The device 6 can be adjusted to operate over a range of different currents and is usually set to operate at a multiple of the rated full load current of the machine. Preferably this multiple is as low as possible to avoid damage to the motor windings etc. through overheating. However, the multiple cannot be too low since, when starting on-line, the motor draws a starting current which is well in excess of full load current and it is not required that circuit 6 should operate for this high starting current. It is now appreciated that the power required on start-up is mainly reactive power and that the starting current is at a low power factor (normally about 0.4). In contrast to this the current arising during short circuit conditions is principally resistive and thus has a high power factor of about 0.9. The present invention takes advantage of this appreciation and in the circuit of FIG. 1 is able to compare the phase of the voltage and current waveforms.

For a start-up condition with a power factor of 0.4 the waveform of current I is applied to terminals b, d and lags the voltage waveform V as shown in FIG. 2. The two waveforms are only in phase for the period P which is relatively short and thus only the power integrated in the shaded area R is available in the resistor 5. The power is converted into a d.c. voltage and received as such at the input to circuit 6.

Referring now to FIG. 3, this shows a waveform diagram for a short circuit condition where the power factor is 0.9. It will be seen that the current I is only lagging the voltage V waveform for a short period and that the waveforms are in phase for substantially the whole of a half-cycle. This means substantially more power as indicated by the shaded area S is available than was the previous case and hence the voltage across resistor 5 which is fed to circuit 6 will be correspondingly higher.

It is therefore possible by the dependence on power factor and the sensing of the phase difference in the two waveforms for the protective circuit 6 to operate satisfactorily to protect the motor against short circuit currents above three times full load current while not operating in response to a start-up current which is, say seven times full load current. This is adequately illustrated in FIG. 4, to which reference is now made.

In FIG. 4 the vertical ordinate A indicates the d.c. input voltage to the protective circuit 6 necessary to cause it to trip, whilst the horizontal ordinate B indicates power factor. In this example it is assumed that the protective circuit 6 is set to operate to cut out the machine when a short circuit current equivalent to three times the full load rated current is applied. The d.c. voltage necessary to achieve this is shown here by the line C at 4.8 volts. The line 3X is the plot of the d.c. voltage for three times full load and it will be seen that it is at a power factor of 0.96, which is the normal operating power factor of the machine that the line 3X crosses line C. When this happens the circuit 6 trips. If there is twice full load current flowing it will be seen from line 2X that line C is never crossed and thus the protective circuit is not operated for these conditions. Lines 4X, 5X, 6X and 7X are plots respectively for four, five, six and seven times full load current. From a study of FIG. 4 the effect of different power factors can be seen. If the power factor is 0.85 the protective circuit 6 will not operate until the short circuit current is four times full load which is where line 4X crosses line C while if the power factor is 0.63 which is where line C is crossed by line 7X it will only operate at seven times full load current.

With a motor operating off three phases then a separate circuit as shown in FIG. 1 will be required for each phase. The response time of the circuit can be adjusted by including a resistor 7 and variable capacitor 8 as a subcircuit in the circuit of the secondary winding of voltage transformer 1 as is shown in dotted outline in FIG. 1. This response time can be adjusted by altering the value of the capacitor which alters the reactive load of the circuit.

In tests the apparatus of the inventor was shown to act reliably with considerable undervoltage in the supply system to the motor. Undervoltages up to 30% were shown to have no appreciable effect on the ability of the apparatus.

I claim:

1. Apparatus for operating a dynamo-electric machine which is provided with a protective circuit arrangement whereby the machine is caused to be switched off if a short circuit current flowing in the machine exceeds a predetermined level, including a voltage transformer and a current transformer, means for deriving a d.c. voltage proportional to the current flowing in the machine, the voltage transformer being connected across the machine supply and the current transformer having its input connected in the current supply to the machine, the protective circuit being arranged to receive current during that period only of a cycle when the outputs from the current and voltage transformers are in phase.

2. Apparatus as claimed in claim 1, and including a full wave rectifier bridge in which the full wave rectifier bridge is connected across one of its diagonals to the output of the voltage transformer whose input is connected to the voltage supply source for the machine, and across the other of its diagonals to the output winding of the current transformer, and a resistor in series with the current transformer in which the resistor is tapped and connected to the said protective circuit (6) to supply the said d.c. voltage.

3. Apparatus as claimed in claim 1, and including a switching device in which the switching device connects the outputs of the current transformer and the voltage transformer to the protective circuit only when the in phase conditions occur.

4. Apparatus as claimed in claim 1, in which a capacitor is included in the output circuit of the voltage transformer.

5. A method of operating a dynamo-electric machine which is provided with a protective circuit arrangement whereby the machine is caused to be switched off if a short circuit current flowing in the machine exceeds a predetermined level, including the steps of monitoring the power factor of the dynamo-electric machine, deriving a d.c. voltage proportional to the resistive element of the current, i.e. the power factor, and feeding the voltage to the protective circuit.

6. A method as claimed in claim 5, further characterized by varying the reactive element in the current to alter the d.c. voltage.

7. A method according to claim 5 further characterized by the steps of feeding across one diagonal of a full wave rectifier bridge a voltage derived from the voltage supply to the machine, and across the other diagonal a current derived from the current flowing in the circuit of the machine, obtaining from the rectifier bridge an output related to the relative phases of the current and voltage supplied to the machine and also to the amplitude of the current in the circuit of the machine and deriving therefrom the voltage proportional to said output.

8. A method according to claim 7 and including inserting a capacitor in the voltage supply across the said one diagonal to increase the phase angle between the current and voltage.

* * * * *